United States Patent [19]

Nakagawa et al.

[11] Patent Number: 5,317,714
[45] Date of Patent: May 31, 1994

[54] DIGITAL SOUND SOURCE APPARATUS AND EXTERNAL MEMORY CATRTRIDGE USED THEREFOR

[75] Inventors: Katsuya Nakagawa; Satoshi Yamato; Hideki Tanaka, all of Kyoto, Japan

[73] Assignee: Nintendo Co., Ltd., Kyoto, Japan

[21] Appl. No.: 768,613

[22] PCT Filed: Jan. 25, 1991

[86] PCT No.: PCT/JP91/00085

§ 371 Date: Sep. 2, 1991

§ 102(e) Date: Sep. 2, 1991

[87] PCT Pub. No.: WO91/11811

PCT Pub. Date: Aug. 8, 1991

[30] Foreign Application Priority Data

Jan. 26, 1990 [JP] Japan ................... 2-16473

[51] Int. Cl.$^5$ .............................................. G06F 13/00
[52] U.S. Cl. ...................................... 395/425; 273/435
[58] Field of Search ................ 395/400, 425; 273/434, 273/435, 148 B, DIG. 28

[56] References Cited

U.S. PATENT DOCUMENTS 5,026,051  6/1991  Lowe et al. ................... 273/435
5,095,798  3/1992  Okada et al. ................. 273/435

FOREIGN PATENT DOCUMENTS 63-40898   3/1988  Japan .
63-253755 10/1988  Japan .
1-185900   7/1989  Japan .
56-116138  9/1998  Japan .
2163929A   3/1986  United Kingdom .

Primary Examiner—David L. Robertson
Attorney, Agent, or Firm—Nixon & Vanderhye

[57] ABSTRACT

A digital sound source apparatus includes a semiconductor memory connected to a central processing unit. The memory has a quantized data storage area and a program data storage area. A quantized data train and a stop code are stored in a series of addresses in the quantized data storage area, a start address is set in a certain address in the program data storage area. When the start address is read from the program data storage area, the quantized data are sequentially read from the quantized data storage area and are sequentially loaded into a data register. When the stop code is read from the quantized data storage area, loading of the data into the data register is inhibited by a read/write control circuit, the quantized data loaded into the data register are converted into an analog sound signal by a D/A conversion circuit.

4 Claims, 6 Drawing Sheets

F I G. 2
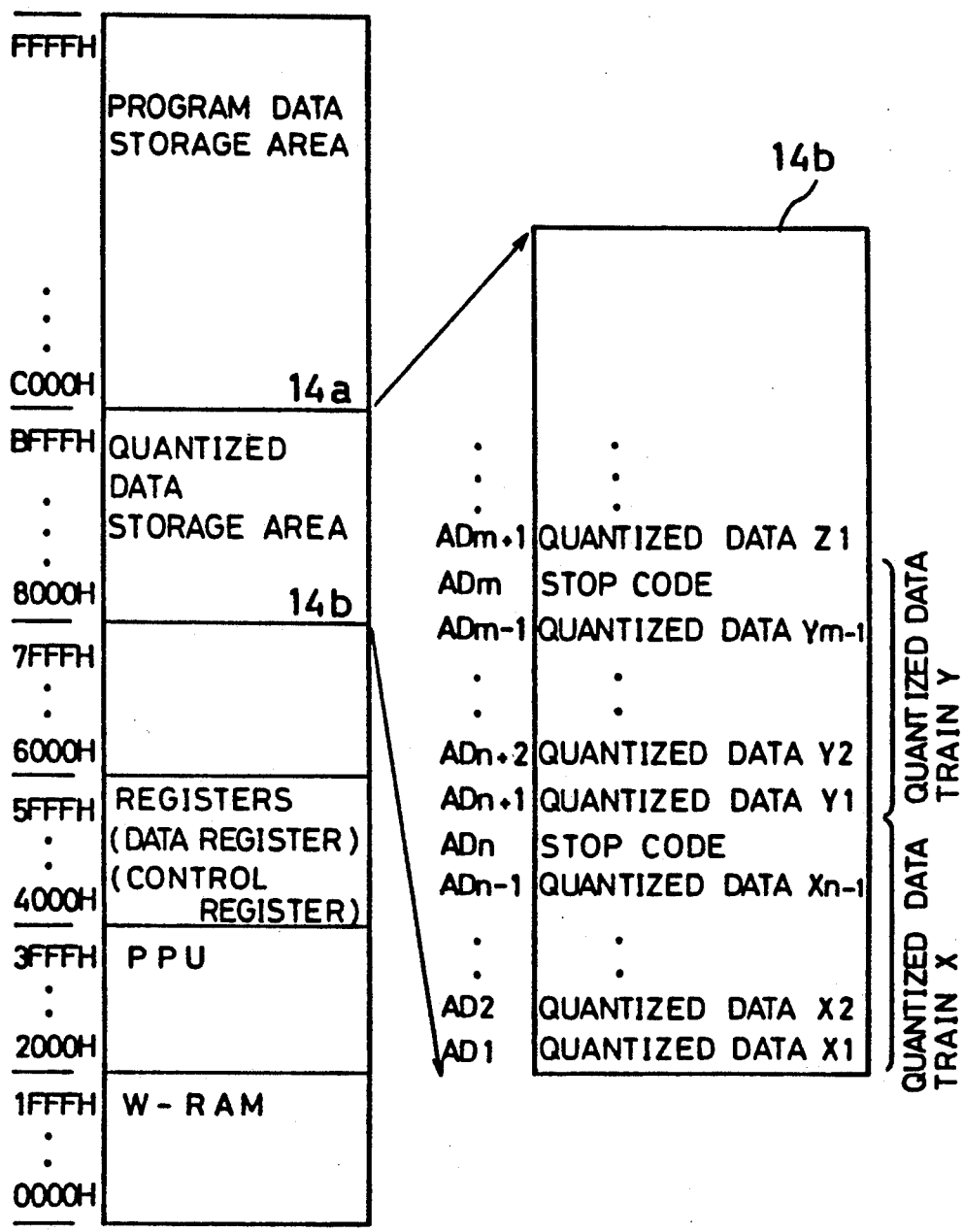

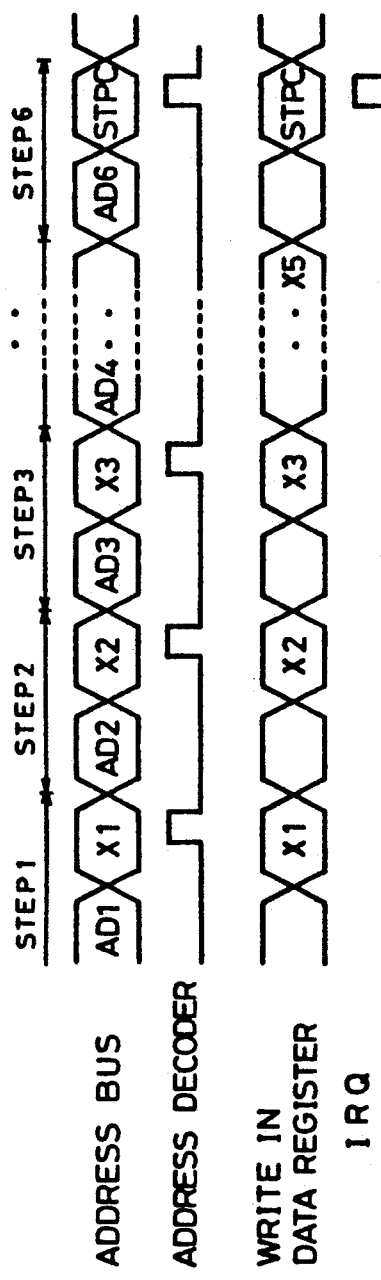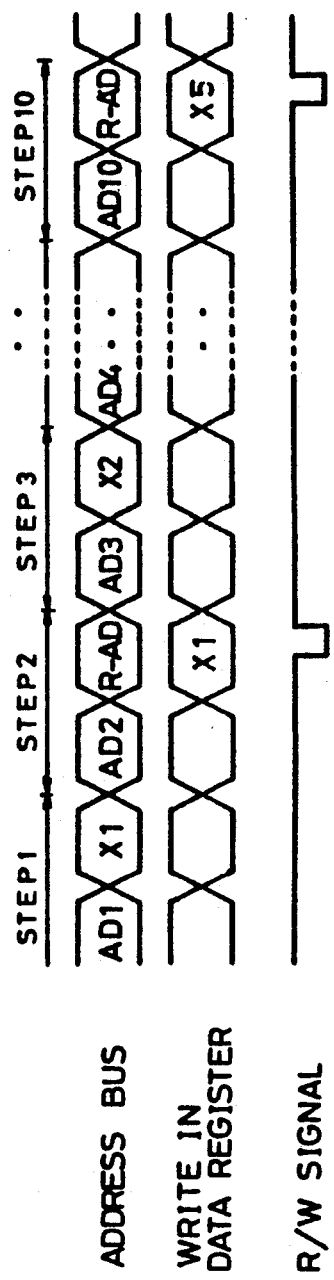

DIGITAL SOUND SOURCE APPARATUS AND EXTERNAL MEMORY CATRTRIDGE USED THEREFOR

TECHNICAL FIELD

The present invention relates to a digital sound source apparatus and an external memory cartridge used therefor. More particularly, the present invention relates to a digital sound source apparatus in which quantized data associated with sounds such as music and a sound effect are stored in a memory and an analog sound signal is generated on the basis of the quantized data in, for example, a television game set, with an external memory cartridge associated therewith.

PRIOR ART

A conventional digital sound source apparatus includes a circuit configuration as shown in FIG. 7. In FIG. 7, a semiconductor memory (hereinafter memory) 4 storing quantized data used to produce sounds is connected to a central processing unit I through an address bus 2 and a data bus 3. When an analog sound signal is generated by reading the quantized data stored in the memory 4 and subjecting the same to digital-to-analog conversion, the following processing is carried out.

In a first step, the CPU 1 applies an address to the memory 4 address data in which the first quantized data of a certain sound is stored and at the same time, causes a read signal R to assume a high level, to thus read the first quantized data and load it into an accumulator 1a. In a second step, the CPU 1 generates address data which designates a data register 6 and applies the address to an address decoder 5, outputs a write signal W and outputs the quantized data loaded into the accumulator 1a onto the data bus 3. Responsively, the address decoder 5 decodes the address data, detects write signal W and applies a write pulse MT to the data register 6. As a result, the data register 6 reads the quantized data, and temporarily stores it until a next write pulse when quantized data are applied. The quantized data stored in the data register 6 is applied to a digital/analog (hereafter D/A) conversion circuit 7 and is converted into an analog signal to be outputted to, for example, an amplifier circuit (not shown).

Such an operation is performed every time quantized data stored in each of addresses in the quantized data storage area of the memory 4 is read.

According to the prior art, the CPU 1 must sequentially perform operations such as (1) addressing of the external memory 4, (2) outputting of a read signal, (3) addressing the data register 6, and outputting of a write signal so as to read quantized data from a designated address and convert the data into an analog signal. Thus a long processing time is required to generate a sound. Therefore, the burden on the CPU 1 is large. In addition, since the number of program steps for generating a sound is high, not only is the program execution time long, but also the required storage capacity is increased.

Moreover, when the digital sound source apparatus is applied to an information processing unit for displaying or processing an image as well as generating a sound as in a television game set, for example, the CPU 1 is used for generating music, a sound effect or the like and is also used for image display. Accordingly, when the time taken to perform processing for generating a sound is long, the capabilities such as a capability to display an image is reduced. In order to prevent the capability to display an image from being reduced, a method of using a high-speed CPU or a CPU dedicated to a sound generating circuit may be considered. In this case, however, the cost of the digital sound source apparatus is high. In addition, this method is not compatible with previously sold information processing units.

SUMMARY OF THE INVENTION

A principal object of the present invention is to provide a digital sound source apparatus capable of performing processing for generating a sound with fewer steps, thus reducing the burden on the central processing unit.

Another object of the present invention is to provide an external memory cartridge used for such a digital sound source apparatus which is detachable from the central processing unit.

A digital sound source apparatus according to the present invention comprises a central processing unit for processing information in a digital manner, an address bus as well as a data bus connected to the central processing unit, a semiconductor memory connected to the address bus and the data bus, temporary storing means as well as write control means connected to the data bus, detecting means connected to the address bus, and a digital/analog converting means.

The semiconductor memory comprises a data storage area for storing quantized data in a predetermined address space and a data storage area storing program data for reading and controlling the quantized data in response to access from the central processing unit. In the quantized data storage area, a plurality of quantized data for generating a series of sounds are stored as a quantized data train, and a stop code is stored in the last address of the quantized data train. Start address data for designating a start address of the quantized data train is stored in a certain address in the program data storage area. The temporary storing means temporarily stores quantized data sequentially applied from the data bus every time a write signal is applied. The detecting means detects the fact that address data applied to the semiconductor memory from the central processing unit designates the quantized data storage area. The write control means generates a write signal every time an output of the detecting means is obtained and applies the same to the temporary storing means and stops generation of the write signal when it detects the stop code. The digital/analog converting means sequentially converts the quantized data temporarily stored in the temporary storing means into an analog signal.

The external memory cartridge is constructed to be detachable from the information processing unit which comprises a central processing unit for processing information in a digital manner, a first address bus and a first data bus respectively connected to the central processing unit, and a connector connected to the first address bus and the first data bus. The external memory cartridge comprises a semiconductor memory, a printed circuit board, temporary storing means, detecting means, write control means, and digital/analog converting.

The semiconductor memory comprises the data storage area for storing quantized data in a predetermined address space and a data storage area storing program data for reading and controlling quantized data in response to access from the central processing unit. In the quantized data storage area, a plurality of data for generating a series of sounds are stored as quantized data trains, and a stop code is stored in the last address of the quantized data trains. Start address data for designating a start address of a quantized data train is stored in a certain address in the program data storage area. The printed circuit board is constructed to be detachable from a connector on the side of the information processing unit. A plurality of terminal portions are connected to the first address bus and the first data bus when the external memory cartridge is inserted into the connector, and a second address bus and a second data bus for connecting the first address bus and the first data bus to the semiconductor memory through the respective terminal portions are formed on the printed circuit board. The temporary storing means is connected to the second data bus, and temporarily and sequentially stores quantized data applied from the second data bus every time a write signal is applied. The detecting means is connected to the second address bus and detects address data applied to the semiconductor memory from the central processing unit which designates the quantized data storage area. The write control means is connected to the second data bus, and applies the write signal to the temporary storing means every time an output of the detecting means is obtained and stops generation of the write signal when it detects the stop code. The digital/analog converting means sequentially converts the quantized data temporarily stored in the temporary storing means to output an analog signal through the terminal portions on the printed circuit board.

According to the digital sound source apparatus in the present invention, a sound can be generated in a digital manner with fewer steps, thereby making it possible to reduce the burden on the central processing unit.

Using the external memory cartridge in the present invention, construction of the information processing unit need not be altered, thus making it possible to maintain compatibility with an information processing unit already on the market.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 2 is an illustrative view showing a memory space of a CPU;

FIG. 4 is a timing chart showing an operation of the embodiment;

FIG. 5 is a timing chart showing an operation of prior art;

BEST MODE FOR PRACTICING THE INVENTION

Figure 1:
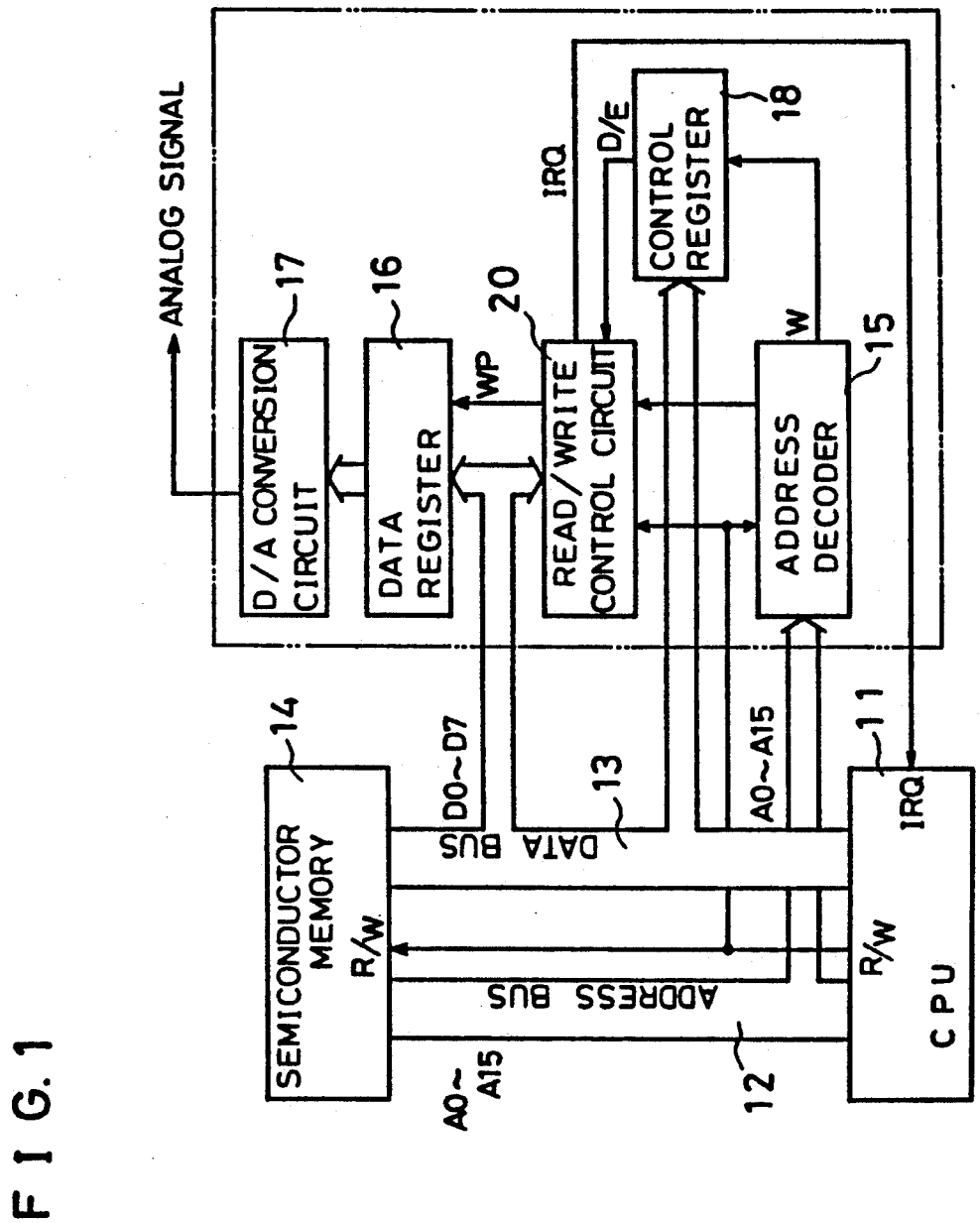
FIG. 1 is a block diagram showing a digital sound source apparatus according to one embodiment of the present invention.

FIG. 1 is a block diagram showing one embodiment of a digital sound source apparatus according to the present invention. In particular, FIG. 1 shows the principal components of the sound source apparatus.

In FIG. 1, a semiconductor memory 14 is connected to a CPU 11 through an address bus 12 and a data bus 13. The memory 14 comprises a program data storage area 14a and a quantized data storage area 14b, as represented, for example, by a memory space of 8000H (H in the last digit indicates a hexadecimal notation) to FFFFH on a memory map as in FIG. 2. In the quantized data storage area 14b, a plurality of quantized data $(X1-Xn-1, Y1-Ym-1, \ldots)$ for generating a series of sounds are stored as a plurality of quantized data trains $(X, Y, \ldots)$, and a stop code is stored in a last address of each of the quantized data trains $(X, Y, \ldots)$. The quantized data is not limited to one obtained by quantizing music played by a musical instrument or a human voice and subjecting the same to pulse code modulation (PCM). For example, the quantized data may be one prepared with a programming method by an input device such as a keyboard.

The plurality of quantized data trains become data for generating a plurality of series of sounds by thus storing the quantized data. If a first address (that is, a start address) of a desired quantized data train is designated, quantized data are continuously and sequentially read until the stop code is detected. To this end, start address data for designating a start address of a certain quantized data train (X, Y, or the like) is stored in advance in a certain address in the program data storage area 14a. The address corresponds to a timing when a desired sound corresponding to the quantized data train is to be generated. In addition, a code which represents silence or no sound and in which all bits are "0" is used, for example, as the stop code.

On the other hand, an address decoder 15 is connected to the address bus 12. A data register 16, a control register 18 and a read/write control circuit 20 are connected to the data bus 13. The address decoder 15 is constructed using a decoder capable of detecting an address for designating the quantized data storage area 14b. In addition, the address decoder 15 applies its detection signal to the read/write control circuit 20 every time address data for designating a range of the quantized data storage area 14b is changed, and applies a write pulse MT to the data register 16 when a write signal W is applied. The data register 16 is constituted by, for example, D-type flip-flops (abbreviated as "D—FF" hereinafter) of 8 bits. The control register 18 is constituted by a D—FF of one bit corresponding to a D0 bit.

The read/write control circuit 20 applies the write pulse WP to the data register 16 every time the detection signal representing the range of the quantized data storage area 14b is applied from the address decoder 15, loads into the register 16 quantized data applied through the data bus 13 at that time, and stops the generation of the write pulse WP when it detects the stop code to inhibit writing into the data register 16. The details of the read/write control circuit 20 will be described later with reference to FIG. 3.

A digital/analog conversion circuit 17 is connected to the data register 16. The D/A conversion circuit 17 subjects the contents stored in the data register 16

(quantized data) to D/A conversion and outputs an analog signal. If an analog signal corresponding to a quantized data train is outputted, one sound is outputted.

The analog signal is applied to a speaker (not shown) through an amplifier (not shown) separately connected to produce a sound.

The control register 18 is used for temporarily storing data (one bit of D0) for switching a first mode (enable; E) in which the quantized data is automatically written into the data register 16 as in the present embodiment and a second mode (disable; D) in which the CPU 11 designates a write address to write quantized data as is done in the prior art. However, the control register 18 is not required for applications in which switching of modes is unnecessary.

The address decoder 15, the data register 16, the D/A conversion circuit 17, the control register 18 and the read/write control circuit 20 may be constituted by a one-chip integrated circuit (IC) so as to improve production efficiency and facilitate assembly.

Figure 3:
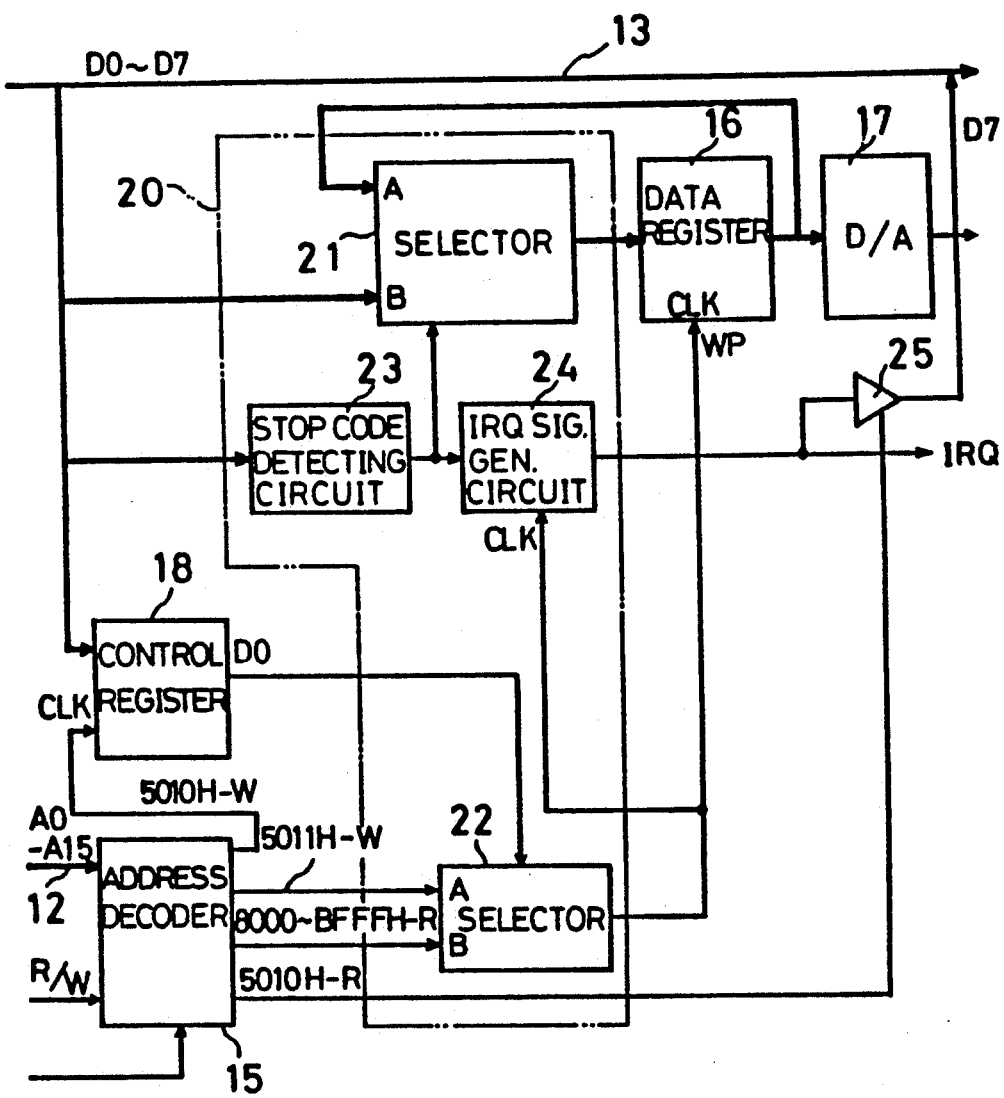
FIG. 3 is a detailed block diagram showing a read-/write control circuit and its related circuits.

FIG. 3 is a detailed diagram showing the read/write control circuit and related circuits. The read/write control circuit 20 comprises selectors 21 and 22, a stop code detecting circuit 23, and an interrupt (IRQ) signal generating circuit 24. When a code which represents a silent sound in which all bits are "0" is used as the stop code, the stop code is detected by circuit 23 which is constituted by a decoder capable of detecting the code. The interrupt signal generating circuit 24 is constituted, for example, by a D−FF.

Description is now made of an operation of the present embodiment with reference to FIGS. 1 to 3. The CPU 11 generally performs operations other than sound generation on the basis of a program set and stored in advance in the program data storage area 14a of the memory 14. However, the following operation is performed when a digital sound is generated.

An operation is performed in a mode (a first mode) in which the quantized data is written into the data register 16 with one step. At a timing when a sound is to be generated, the CPU 11 applies mode designation data (for example, D0 bit data in an address of 5010H) to the control register 18 through the data bus 13 so as to designate an operation mode of the read/write control circuit 20 as the first mode, and outputs control register designation address data (for example, 5010H to the address bus 12, thereby to load the mode description data into the control register 18.

Thereafter, in order to generate a sound corresponding to a certain quantized data train (for example, X), the CPU 11 presets in an address counter (not shown) address data (AD1) for designating a start address of the quantized data train X which is to be outputted so as to output the same to the address bus 12 and at the same time, outputs a read signal R. At this time, the address decoder 15 decodes the address data, detects the designation of the quantized data storage area 14b (for example, any one of addresses in a range of 8000H to BFFFH), and generates one pulse in synchronization with a system clock SCK. This pulse is applied to a B input terminal of the selector 22. Responsively, the selector 22 applies to the data register 16 a signal to an input terminal as a write pulse WP because it receives at that time a signal (at a high level) representing the first mode from the control register 18.

On the other hand, the memory 14 outputs the quantized data X1 in response to the designation of the start address of the quantized data train X, and applies the same to a B input terminal of the selector 21 through the data bus 13. At this time, a stop code detection output (at a high level) is not applied to the selector 21 from the stop code detection circuit 23. Accordingly, the selector 21 selects the quantized data X1 from the B input terminal and applies the same to the data register 16. Consequently, the data register 16 loads (temporarily stores) the quantized data X1. This quantized data X1 is subjected to D/A conversion by the D/A converter 17 and is outputted as an analog signal.

Subsequently, the CPU 11 increments an address counter (not shown) to generate address data for designating the next quantized data X2, and outputs the same to the address bus 12. Responsively, the address decoder 15 detects the designation of the quantized data storage area 14b and outputs one pulse in synchronization with a system clock SCK. This pulse is applied as the write pulse WP to the data register 16 through the selector 22. At the same time, the quantized data X2 is read from the memory 14 and is applied to the B input terminal of the selector 21 through the data bus 13, to be an input of the data register 16. Therefore, the data register 16 loads the quantized data X2.

Thereafter, in the same manner the write pulse WP is applied to the data register 16 every time the address data for designating the quantized data storage area 14b is changed by sequentially designating addresses of the quantized data train X, and the quantized data as addressed is read, so that the quantized data are sequentially stored in the data register 16. Thus, the quantized data X1 to Xn sequentially stored in the data register 16 are subjected to D/A conversion by the D/A converter 17 and are outputted as analog signals. A series of quantized data (that is, data in the quantized data train X) are outputted as an analog signal, thereby to generate sound or music.

When the CPU 11 designates the last address (ADn+1) of the quantized data train X, the stop code is read from the memory 14. This stop code is applied to the selector 21 and the stop code detecting circuit 23 through the data bus 13. At this time, in the same manner as the above described operation, the address decoder 15 generates one pulse and the selector 22 outputs the write pulse WP. Accordingly, the data register 16 loads the stop code. The stop code detecting circuit 23 detects the stop code in response to reading of the stop code and applies an output at a high level to the selector 21. Therefore, the selector 21 thereafter applies data from an A input terminal to the data register 16. Consequently, the stop code (data in which all bits are "0") continues to be loaded into the data register 16 while circulating through the data register 16 and the selector 21. As a result, the D/A conversion circuit 17 continuously outputs analog signals at a zero level, resulting in a silent state.

At the same time, the interrupt signal generating circuit 24 generates an interrupt (IRQ) signal in response to application of the output at a high level from the stop code detecting circuit 23 and the clock pulse from the selector 22, and continues to generate the IRQ signal until the stop code detecting circuit 23 detects data other than the stop code and brings its output into a low level.

On the other hand, the CPU 11 generates an address (for example, 5010H-R) for designating reading of an interrupt signal at a timing when the presence or absence of the interrupt signal is to be detected on the basis of program processing. Responsively, the address decoder 15 generates a signal designating reading of an interrupt signal to open a gate circuit 25. Accordingly, the gate circuit 25 outputs the IRQ signal to the data bus 13. As is obvious from the embodiment shown in FIG. 1, when the IRQ signal is directly applied to the CPU 11 without passing through the data bus 13, the gate circuit 25 is not required.

Furthermore, when a sound is generated on the basis of the quantized data Y1 to Ym in the quantized data train Y, the CPU 11 designates a start address (An+1) and then, sequentially increments the address to (An+2) to Am, thereby to perform the same operation. However, setting of the mode in which the CPU 11 writes each quantized data into the data register 16 with one step is not required provided that the mode once set does not need to be changed.

Figure 7:
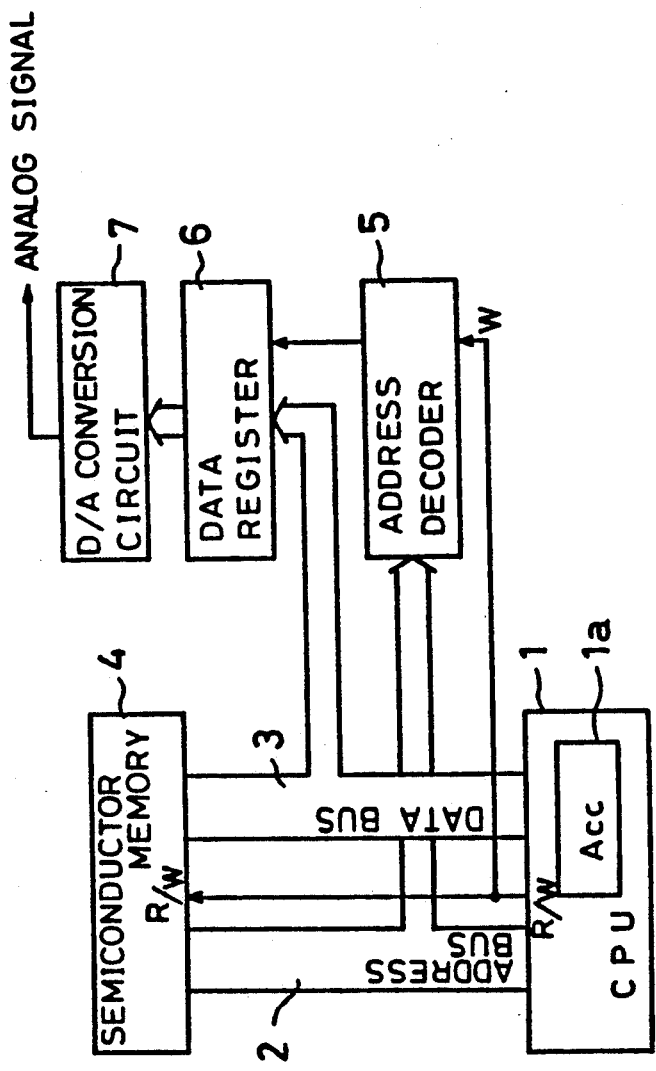
FIG. 7 is a circuit diagram showing on example of a conventional digital sound source apparatus.

Meanwhile, the embodiment shown in FIG. 3 is so constructed as to allow switching between the first mode in which the CPU 11 writes each quantized data into the data register 16 with one step and the mode (second mode) in which the CPU 11 writes each quantized data into the data register 16 with two steps in the same manner as the prior art shown in FIG. 7 so as to also allow a sound to be generated in the conventional system shown in FIG. 7. Description is now made of an operation in the second mode in which quantized data is written with two steps.

In the second mode, data for designating the second mode (for example, logical "0") is set in a D0 bit of an address (for example, 5010H) corresponding to the control register 18. The CPU 11 designates the address 5010H prior to reading of quantized data and loads in advance second mode designation data into the control register 18. In this case, the control register 18 does not output an enable signal (that is, outputs a disable signal at a low level), so that the selector 22 is disabled. Consequently, even if data which represents a silent sound and in which all bits are "0" (corresponding to the stop code) is read from the memory 14, the interrupt signal generating circuit 24 does not generate an IRQ signal.

When the second mode is used in which each quantized data is written into the data register 16 with two steps, read address data, and write address data for designating writing into the data register 16 of quantized data are programmed in the program data storage area 14a with two steps, and no stop code is programmed at the end of each quantized data train in the quantized data storage area 14b. The CPU 11 designates an address storing the read address data of certain quantized data in the first step, thereby to read the quantized data from the address and load the same into an accumulator (not shown).

Thereafter, the CPU 11 outputs address data (5011H-W) for designating writing into the data register 16 in the second step. This address data is detected by the address decoder 15, and the address decoder 15 applies a decode output to the A input terminal of the selector 22. The selector 22 generates a write pulse WP at every time when an input signal is applied to the A input terminal and applies the same to the data register 16. Therefore, quantized data is read form the memory 14 to be applied to the selector 21 through the data bus 13. The selector 21 selects the quantized data applied to the B input terminal and applies the same to the data register 16. Accordingly, the data register 16 loads this quantized data.

The above described operation of writing quantized data to the data register 16 with two steps is performed for each quantized data. An operation of the D/A conversion circuit 17 is the same as that in the first mode in which quantized data is written with one step and hence, description thereof is omitted.

Meanwhile, on the program design, when the present invention is used for applications in which the same second mode as that in the prior art is not required, no mode switching circuit using the control register 18 and setting of program data for switching modes are required.

Referring now to the following tables 1 and 2 and FIGS. 4 and 5, a description is presented as to reasons why the burden on the CPU 11 in the first mode can be reduced, as compared with that in the second mode.

TABLE 1

| address | instruction | operand | cycle |
| --- | --- | --- | --- |
| AD1 | LDA | X1 | 4 |
| AD2 | LDA | X2 | 4 |
| AD3 | LDA | X3 | 4 |
| AD4 | LDA | X4 | 4 |
| AD5 | LDA | X5 | 4 |
| AD6 | LDA | STPC | 4 |
| AD7 | — | — | — |
| AD8 | — | — | — |
| AD9 | — | — | — |
| AD10 | — | — | — |

TABLE 2

| address | instruction | operand | cycle |
| --- | --- | --- | --- |
| AD1 | LTA | X1 | 4 |
| AD2 | STA | R-AD | 4 |
| AD3 | LDA | X2 | 4 |
| AD4 | STA | R-AD | 4 |
| AD5 | LAD | X3 | 4 |
| AD6 | STA | R-AD | 4 |
| AD7 | LDA | X4 | 4 |
| AD8 | STA | R-AD | 4 |
| AD9 | LDA | X5 | 4 |
| AD10 | STA | R-AD | 4 |

The table 1 and FIG. 4 show the operation in the first mode, and the table 2 and FIG. 5 show the operation in the second mode.

Consider a case where one sound is expressed by five quantized data, as shown in table 1. In the first mode, quantized data X1 to X5 are sequentially stored as operands in addresses AD1 to AD5, and a stop code (STPC) is stored in an address AD6 just behind the addresses AD1 to AD5. In the second mode, quantized data X1 to X5 and data R-AD for designating writing into the data register are alternately stored as operands sequentially in addresses AD1 to AD10. In this case, an instruction word "LDA" indicates a read instruction of data, and an instruction word "STA" indicates a load instruction into the data register. In the example as shown, one step is carried out in four cycles of a machine clock.

Comparison between FIGS. 4 and 5 indicates the following. In the first mode, the read address is designated in the first half of a one step period (four cycles), and the quantized data is read and at the same time, is written into the data register 16 in the second half thereof. On the other hand, in the second mode, the read address is designated in the first half of an odd step period and the quantized data loaded into the accumulator is written in the second half thereof, and a write address is designated in the first half of an even step period and the quantized data loaded into the accumulator is read and at the same time, is written into the data register 16 in the second half thereof.

Consequently, in the first mode according to the present embodiments, the number of program steps may be approximately one-half that in the conventional system, that is, in the second mode. Accordingly, processing time required to generate a sound can be reduced to approximately half, thereby making it possible to significantly reduce the burden on the CPU 11. In addition, if the burden on the CPU 11 is thus reduced, the CPU 11 can be utilized for other processing. In addition, the first mode has the advantage that since the number of program steps can be reduced, time and labor required to develop a program can be reduced. Such an effort or advantage is very efficient in an information processing unit so adapted as to simultaneously carry out control for image display and processing for generating a sound in, for example, a television game set. Description is now made of a case where the present invention is applied to a television game set.

Figure 6:
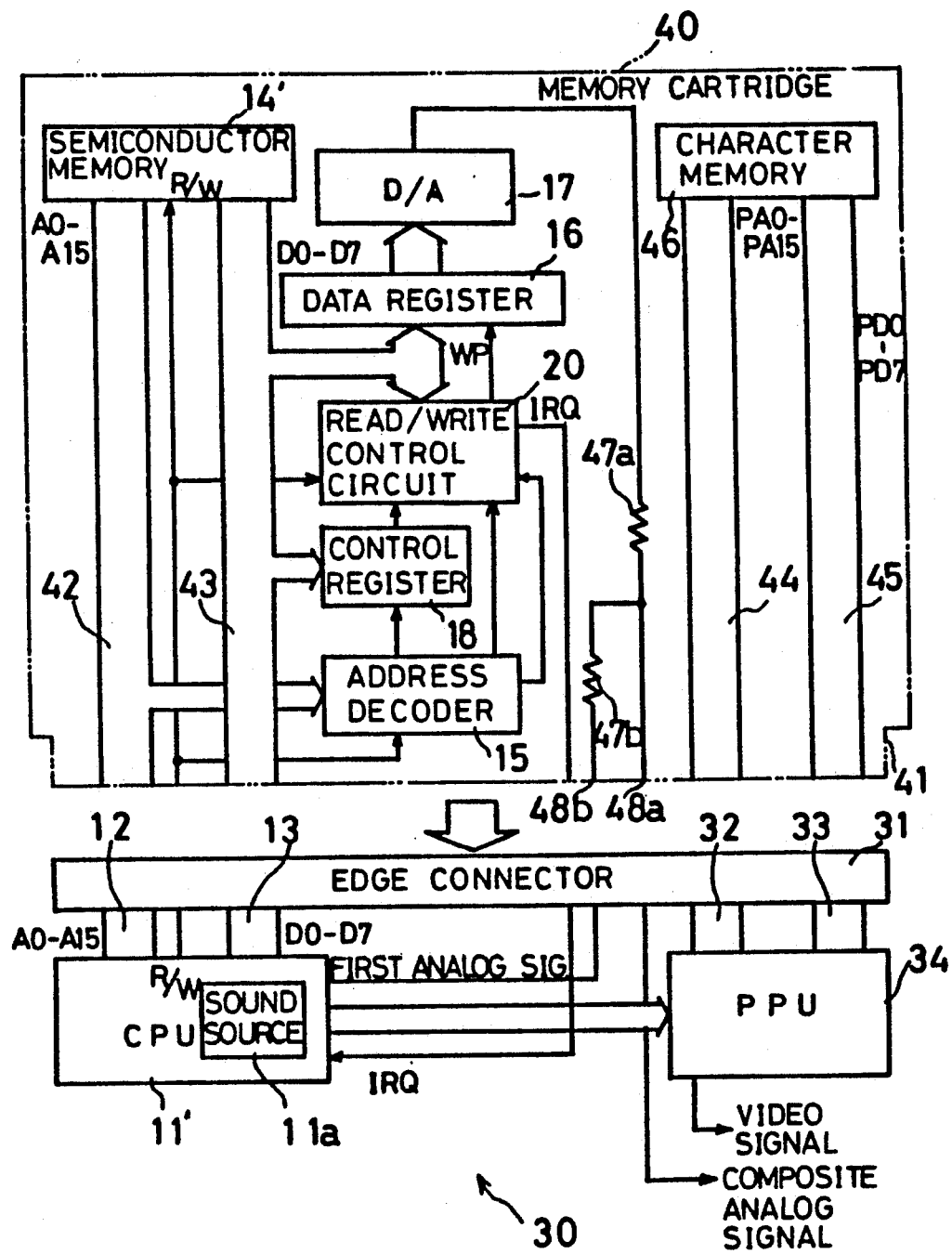
FIG. 6 is a block diagram showing another embodiment of the present invention, particularly showing a main unit of a television game set to which the present invention is applied and an external memory cartridge which characterizes the embodiment.

FIG. 6 is a block diagram showing another embodiment of the present invention, particularly showing a main unit of a television game set 30 to which the present invention is applied and an external memory cartridge 40 which characterizes the embodiment.

In FIG. 6, the main unit of the television game set 30 comprises a CPU 11', and the CPU 11' comprises an analog sound source circuit 11. The analog sound source circuit 11 a comprises four types of sound generators for generating two types of square waves, a triangular wave and a sine wave. An output of the analog sound source circuit 11a is provided as a first analog signal, and is introduced into the external memory cartridge 40 as described later through an edge connector 31.

On the other hand, an edge connector 31 is connected to the CPU 11' through a first address bus 12 and a first data bus 13. A picture processing unit (abbreviated as "PPU" hereinafter) 34 is connected to the edge connector 31 through an address bus 32 for image processing and a data bus 33 for image processing. The PPU 34 generates dot data which is synchronized with the scanning of a scan type display on the basis of character data applied from a character memory 46 as described later and outputs the same as an image signal under the control of the CPU 11', which uses the technique disclosed in, for example, Japanese Patent Laid-Open Gazette No. 11814/1984 (corresponding U.S. Pat. No. 4,824,106).

The external memory cartridge 40 is constructed to be detachable from the edge connector 3 1, and comprises a printed circuit board 41 having a plurality of terminals electrically connected to the main unit when it is loaded on the edge connector 31. A second address bus 42 connected to the first address bus 12, a second data bus 43 connected to the first data bus 13, an address bus 44 connected to the PPU address bus 32, and a data bus 45 connected to the PPU data bus 33 are respectively formed on the printed circuit board 41. A memory 14', an address decoder 15, a data register 16, a control register 18, and/or a read/write control circuit 20 are respectively connected to the second address bus 42 and/or the second data bus 43, as in the embodiment shown in FIG. 1. The character memory 46 is connected to the address bus 44 and the data bus 45.

The memory 14' comprises a program data storage area 14a' and a quantized data storage area 14. Quantized data used for a digital sound source is stored in the quantized data storage area 14b as in the embodiment shown in FIG. 1. Data for generating a sound in an analog manner by the analog sound source circuit 11a is stored in addition to program data for controlling the PPU 34 to display an image in the program data storage area 14a'. For example, the program data storage area 14a' stores sound type data for designating the selection of any one of the four types of sound generators or a combination of the sound generators, and data on a frequency, a waveform or the like for designating a musical interval or a tone. If the data for an analog sound source are not only stored individually but also programmed so that they can be outputted in synchronization with quantized data, two series of sounds for an analog sound source and a digital sound source can be generated in combination, so that a varied sound can be generated, which is effective as a sound effect. In addition, program data for returning to the original operation for image display when an IRQ signal is applied can be also set and stored in the program data storage area 14a'.

In order to output a second analog signal which is an output of the D/A conversion circuit 17 in combination with a first analog signal which is an output of the sound source circuit 11a, a conductive pattern from an output end of the D/A conversion circuit 17 is formed so as to extend to a terminal 48a on an edge portion of the printed circuit board 41 through a resistor 47a. In addition, a conductive pattern formed through a terminal 48b at a position corresponding to an output line of the first analog signal from the analog sound source circuit 11 a and a resistor 47b is connected to the terminal 48a. Consequently, the first analog signal and the second analog signal are combined with each other on the printed circuit board 4 and then, is derived from the television game set 30 through the edge connector 31. Meanwhile, operations of the address decoder 15, the data register 16, the D/A conversion circuit 17, the control register 18, and the read/write control circuit 20 in the present embodiment are the same as those in the embodiment shown in FIG. 1 and hence, description thereof is omitted.

The construction of the embodiment shown in FIG. 6 has the advantage that a digital sound source can be added on the side of the external memory cartridge 40 without altering a circuit configuration of the existing television game set 30, thereby to make it possible to achieve a sound source which varies in tone and the type of sounds while maintaining compatibility with the existing television game set 30. Therefore, it is possible to also generate language, complicated music, and a sound like synthesizer by the combination with a digital sound which cannot be generated by the conventional television game set.

Although the present invention has been described and illustrated in detail, it is clearly understood that the same is by way of illustration and example only and is not to be taken by way of limitation, the spirit and scope of the present invention being limited only by the terms of the appended claims.

What is claimed:

1. A digital sound source apparatus comprising:
   a central processing unit for processing information in a digital manner;
   an address bus connected to said central processing unit;
   a data bus connected to said central processing unit;

a semiconductor memory connected to said address bus and said data bus and having a data storage area for storing quantized data in a predetermined address space and a data storage area for storing program data for reading and controlling at least the quantized data in response to access from said central processing unit, said semiconductor memory storing a plurality of quantized data for generating a series of sounds as a quantized data train and a stop code in a last address of the quantized data train in said quantized data storage area, and start address data for designating a start address of the quantized data train in a certain address in said program data storage area;

temporary storing means connected to said data bus for temporarily and sequentially storing the quantized data applied from said data bus every time a write signal is applied;

detecting means connected to said address bus for detecting that the address data applied to said semiconductor memory from said central processing unit designates said quantized data storage area;

write control means connected to said data bus for generating said write signal in response to an output of said detecting means to apply the write signal to said temporary storing means and for stopping the generation of the write signal in response to detection of said stop code; and digital/analog converting means for sequentially converting the quantized data temporarily stored in said temporary storing means into an analog signal.

2. A digital sound source apparatus according to claim 1, wherein said write control means includes stop code detecting means for detecting said stop code and further includes inhibiting means for applying an interrupt signal to said central processing unit in response to an output of said stop code detecting means to inhibit addressing of said quantized data storage area.

3. A digital sound source apparatus according to claim 2, wherein said semiconductor memory further stores image processing data for causing said central processing unit to execute arithmetic operation processing for displaying an image, and said central processing unit is switched to execution of the arithmetic operation processing for displaying an image on the basis of the image processing data in response to application of the interrupt signal from the inhibiting means of said write control means.

4. An external memory cartridge detachably connected to an information processing unit which comprises a central processing unit for processing information in a digital manner, a first address bus and a first data bus respectively connected to said central processing unit, and a connector connected to said first address bus and said first data bus, said external memory cartridge comprising:

a semiconductor memory having a data storage area for storing quantized data in a predetermined address space and a data storage area storing program data for reading and controlling at least the quantized data in response to access from said central processing unit, said semiconductor memory storing a plurality of quantized data for generating a series of sounds as a quantized data train and a stop code in a last address of the quantized data train in said quantized data storage area, and start address data for designating a start address of the quantized data train in a certain address in said program data storage area;

a printed circuit board attachable to or detachable from said connector, said printed circuit board being formed with a plurality of terminal portions which are connected to said first address bus and said first data bus when the external memory cartridge is inserted into the connector, and a second address bus and a second data bus for connecting said first address bus and said first data bus to said semiconductor memory through respective terminal portions;

temporary storing means mounted on said printed circuit board and connected to said second data bus for temporarily and sequentially storing the quatized data applied from said second data bus sequentially every time a write signal is applied;

detecting means connected to said second address bus for detecting that the address data applied to said semiconductor memory from said central processing unit designates said quantized data storage area;

write control means connected to said second data bus for applying said write signal to said temporary storing means in response to an output of said detecting means and for stopping generation of the write signal in response to detection of said stop code; and digital/analog converting means for sequentially converting the quantized data temporarily stored in said temporary storing means into an analog signal and outputting the analog signal through said terminal portions on said printed circuit board.

* * * * *